United States Patent [19]

Eisenstadt

[11] Patent Number: 5,173,618

[45] Date of Patent: Dec. 22, 1992

[54] CLOCK GENERATOR FOR PROVIDING A PAIR OF NONOVERLAPPING CLOCK SIGNALS WITH ADJUSTABLE SKEW

[75] Inventor: Robert E. Eisenstadt, Santa Clara, Calif.

[73] Assignee: VLSI Technology, Inc., San Jose, Calif.

[21] Appl. No.: 523,444

[22] Filed: May 14, 1990

[51] Int. Cl.$^5$ .................. H03K 3/017; H03K 17/56; H03K 17/00
[52] U.S. Cl. .................. 307/269; 307/265; 307/244; 328/153; 328/105
[58] Field of Search .............. 307/262, 269, 480, 595, 307/606, 603, 593, 265, 608; 328/55, 60, 62, 63

[56] References Cited

U.S. PATENT DOCUMENTS

| | | | |
|---|---|---|---|
| 4,140,927 | 2/1979 | Feucht | 328/62 |
| 4,877,974 | 10/1989 | Kawai et al. | 328/63 |
| 4,912,340 | 3/1990 | Wilcox et al. | 307/262 |

OTHER PUBLICATIONS

Standard Microsystems Corp. Product Information Sheet pp. 293–300 on CRT Video Timer and Controller VTAC.

Primary Examiner—William L. Sikes
Assistant Examiner—Sinh Tran
Attorney, Agent, or Firm—John A. Frazzini

[57] ABSTRACT

A clock generator for producing a pair of nonoverlapping clock signals. In one embodiment, a flip-flop functions as a state machine to clock a pair of complementary switches that direct successive pulses of a clock signal alternately to one and then the other of a pair of output clock signal ports. In another embodiment, each of a pair of output clock signals is generated by an AND gate having a first input connected directly to a clock input and having a second input connected through a delay element. Mechanisms are included to sense the amount of delay introduced by this delay element and to select a new delay value when the sensed delay is outside of an operating range.

4 Claims, 5 Drawing Sheets

CLOCK GENERATOR FOR PROVIDING A PAIR OF NONOVERLAPPING CLOCK SIGNALS WITH ADJUSTABLE SKEW

In the figures, the first digit of a reference numeral indicates the first figure in which is presented the element indicated by that reference numeral.

BACKGROUND OF THE INVENTION

This invention relates in general to clock generators and relates more particularly to clock generators that provide a pair of nonoverlapping clock signals.

As clock periods become shorter, the effects of signal delays within a circuit become increasingly important. For signal processing in closely spaced circuits on an integrated circuit (IC), the delay of a clock signal in reaching on-chip components is critical, because, the states of on-chip components change in response to the transitions of the clock at the locations of those components. This is dependent on the delays of the clock signals travelling from the clock generator to these circuits.

As ICs become larger, there is an increased amount of clock signal delay. Therefore, it becomes useful to have a second staggered clock signal to help control signal processing. It is increasingly common to include on a chip a clock generator that, from an input clock signal produces two or more staggered clock signals for use on that chip. This enables various actions to be staggered at intervals smaller than the rate of the input clock signal. If these two clock signals experience the same delay in reaching all circuits, then the delay problem will be solved. Unfortunately, these two clock signals will not experience identical delays to all components on an IC.

The relative delay (i.e., the skew) between these clock signals has a significant effect on processing in ICs. At the present time, skew of up to 5 nanoseconds is not uncommon. Such skew is important if it is comparable to the period of a clock signal. If this occurs, then the two clock signals will not be synchronous. For a 20 MHz clock, such as is readily available today, each clock period is 50 nanoseconds. Therefore, a pair of 20 MHz clock signals can be offset by no more than 25 nanoseconds. It is the ratio of skew to clock period that is important in determining whether IC designs will be affected by clock skew. This problem will become greater as clock rates increase further. In particular, for a pair of 100 MHz clock signals, a 5 nanosecond skew will convert nonoverlapping clock signals into overlapping clock signals.

When circuits are enabled by the binary one state of two staggered clock signals, it is important that only one of these two clock signals be in the binary one state at any given circuit at a given time. These two clock signals are said to be "nonoverlapping" if only one of these clock signals is in a binary one state at a given time over the entire IC. This definition and the discussion below is given in terms of positive logic circuitry, but the case of negative logic circuitry is equivalent.

FIG. 1 illustrates a clock generator that, in response to an input clock signal C produces a pair of output clock signals $\phi_1$ and $\phi_2$. A positive edge D-type flip-flop 11 and a negative edge D-type flip-flop 12 each has its clock input responsive to the input clock signal C and has its reset input responsive to an input reset signal R. An intermediate signal $Q_1$ is produced at the $\overline{Q}$ output of flip-flop 11 and an intermediate signal $Q_2$ is produced at the $\overline{Q}$ output of flip-flop 12. $Q_1$ is supplied to the D input of flip-flop 11, to an input of an AND gate 13 and to an inverting input of an AND gate 14. $Q_2$ is supplied to the D input of flip-flop 12, to an input of an AND gate 13 and to an inverting input of an AND gate 14. Output clock signals $\phi_1$ and $\phi_2$ are produced at the outputs of AND gates 13 and 14, respectively.

The operation of this circuit can be understood by consideration of the signal timing diagram in FIG. 2. $\phi_1$ is high only if both $Q_1$ and $Q_2$ are high, whereas $\phi_2$ is high only if both $Q_1$ and $Q_2$ are low. These two conditions are mutually exclusive, so this circuit produces nonoverlapping clock signals $\phi_1$ and $\phi_2$. In the ideal case in which input clock signal C has a 50% duty cycle and signal delays through the two flip-flops are equal, output clock signals have 25% duty cycles, have a frequency that is half of input clock signal C and are offset by one-half cycle.

Unfortunately, there is a large delay for the clock input signal to pass through the flip-flops. Any difference in delay between these two flip-flops will affect the duty cycle of the output clock signals. Contemporary logic gates can exhibit propagation delays that range from values on the order of or less than one nanosecond to values on the order of or greater than ten nanoseconds, depending on the IC digital logic family used to implement the gates. Because the delay through a D-type flip-flop can be 5 times larger than logic gates, the duty cycle of output clock signals $\phi_1$ and $\phi_2$ can be significantly affected by variations in relative delay time for flip-flops 11 and 12. The average delay through flip-flops 11 and 12 will delay the action of other circuits responsive to clock signals $\phi_1$ and $\phi_2$. If each of two or more chips contains a clock generator like that in FIG. 1 to generate a pair of on-chip clock signals $\phi_1$ and $\phi_2$ from the same input clock signal C, the output signals from these different chips can be nonsynchronous. Therefore, it is advantageous to minimize the delay introduced by the on-chip clock generator.

Another disadvantage of the clock generator of FIG. 1 is that the clock rate of output clock signals $\phi_1$ and $\phi_2$ is half that of input clock signal C. FIG. 5 illustrates a clock generator that overcomes this limitation. At time $t=t_0$, a leading edge of a positive pulse of an input clock signal C is applied to an input port 51 of the clock generator. This input clock signal is applied through a delay element 53 to a first input A of an AND gate 52 and is also applied directly to a second input B of AND gate 53. This produces, at an output port 54 connected to the output of AND gate 53, a first output clock signal $\phi_1$ having a leading edge that is delayed relative to clock signal C by a time $D_3$ equal to the delay of delay element 52. Similarly, input clock signal C is also applied through an invertor 55 and a delay element 56 to a first input D of an AND gate 57 as well as through invertor 55 directly to a second input E of AND gate 57. This produces on an output port 57 connected to the output of AND gate 58 an output clock signal $\phi_2$. In this embodiment, delay elements 52 and 56 each consists of a set of four inverters 59 connected in series.

The operation of this circuit is illustrated in the timing diagram of FIG. 6. The input clock has a period P and positive pulses of width W. In the interval from $t=t_0$ to $t=t_1\equiv t_0+D_3$, signal A is low and signal B is high so that $\phi_1$ is low. From time $t=t_1$ to $t=t_2\equiv t_0+W$ (where W is the width of a clock pulse), signals A and B are both high so that $\phi_1$ is high. From time $t=t_2$ to $t = t_3 \equiv t_1 + W$, signal A is high and signal B is low so $\phi_1$ is low. From time $t = t_3$ to $t = t_4 \equiv t_0 + P$, signals A and B are both low so that $\phi_1$ remains low. Therefore, output clock signal $\phi_1$ has the same period P as input clock signal C. The width $W_0$ of the positive pulses of output clock signal $\phi_1$ is $W - D_3$.

The generation of output clock signal $\phi_2$ is similar to that of $\phi_1$, except that there is an extra inversion and delay introduced by invertor 55. If clock C had a 50% duty cycle, if the delay $D_3$ of delay element 52 were equal to the delay $D_4$ of delay element 56 and if the delay of invertor 55 were negligible, then this circuit would ensure that output clock signals $\phi_1$ and $\phi_2$ were 180° out of phase. More importantly, if the delay of invertor 55 were negligible, then high state pulses of $\phi_1$ could occur only if clock signal C were high and high state pulses of $\phi_2$ could occur only if clock signal C were low, thereby ensuring that these two output clock signals are nonoverlapping. For an invertor 55 delay less than $D_3$, these two clock signals will be nonoverlapping.

Unfortunately, because the width $W_0$ of the output pulses of the output clock signal are $W - D_3$, if the delay $D_3$ becomes comparable to W, then the width of these pulses can become unusably narrow and can even vanish. The delays $D_3$ and $D_4$ are functions of temperature, applied voltages, and manufacturing process and can produce variations in delays that vary by a factor of 4 from minimum to maximum values. These variations in delays are large enough to enable $D_3$ to vary over a range that makes the output pulse width vanish. As $D_3$ varies through this value, not only could the pulse width temporarily vanish, in addition, $D_3$ could begin to exceed W. If it does, then the output pulse transitions would jump from the trailing edges of pulses of B to the leading edge of these pulses. If the duty cycle of the input clock signal were 50%, this jump would produce a sudden phase shift of the output clock signal by 180°. IC functionality will be disrupted if the pulse width of the output clock signal vanishes or the phase of the output clock signal jumps suddenly.

FIG. 7 shows another prior art clock generator that is designed to produce a pair of nonoverlapping clock signals of frequency f from an input clock signal of frequency f. An input clock is applied to an input port 71 that is connected directly to a first input of a first NOR gate 72 and is connected through an invertor 73 to a first input of a second NOR gate 74. The output of NOR gate 72 is connected to an output port 75 and the output of NOR gate 74 is connected to an output port 76. The output clock signal $\phi_1$ produced on output port 75 is fed back to a second input of NOR gate 72 and the output clock signal $\phi_2$ produced on output port 76 is fed back to a second input of NOR gate 74.

The operation of this circuit can be understood by reference to the timing diagram in FIG. 8. In interval a, because input clock signal C is high, NOR gate 72 drives $\phi_1$ low as indicated by arrow 81. In interval b, because signal A is high, NOR gate 74 drives $\phi_2$ low as indicated by arrow 82. In interval c, because signals C and $\phi_2$ are both low, NOR gate 72 drives $\phi_1$ high as indicated by arrows 83 and 84. In interval d, because signals A and $\phi_1$ are both low, NOR gate 74 drives $\phi_2$ high, as indicated by arrows 85 and 86. However, in interval e, because signals C and A are both low, $\phi_1$ and $\phi_2$ are constrained only that one is high and the other is low. In this interval, the signal is unstable and can be a linear sum of components for which $\phi_1 = -\phi_2$ and oscillates between 0 and 1 at a multiple of the period at which a signal can travel around the loop from the output of NOR gate 72 to the second input of NOR gate 74 and then back from the output of NOR gate 74 to the second input of NOR gate 72. More important than possible unstable portions of output clock signals, are output signals having a nearly 50% duty cycles because then only a small amount of clock skew will result in these signals overlapping.

SUMMARY OF THE INVENTION

In accordance with the illustrated preferred embodiment, a clock generator is presented that, in response to an input clock signal C, produces a pair of nonoverlapping clock signals. A D-type flip-flop is responsive to the input clock signal to produce a control signal $\overline{Q}$ of half the frequency of the input clock signal. The clock signal is also provided to a pair of clocked buffers, a first of which is clocked by the output of the D-type flip-flop and the second of which is clocked by the inverse of the output of the D-type flip-flop. The flip-flop therefore functions as a state machine that controls passage of the clock signal through these two clocked buffers so that every second pulse of the clock signal is transmitted to a first output port as an output clock signal $\phi_1$ and the remaining pulses are transmitted to a second output port as an output clock signal $\phi_2$. These two output clock signals are nonoverlapping and have a frequency equal to half the frequency of the input clock signal.

No transition in the control signal should be allowed to occur during an interval when the clock signal is high, otherwise part of that clock pulse will be routed to one of the output clock signals and the remainder of that pulse will be routed to the other of the output clock signals. This would produce glitches in the output clock signals. To help assure that this situation does not occur, at both of the clocked buffers, the control signal $\overline{Q}$ is delayed relative to the clock signal such that each positive pulse of the clock signal is centered within an interval in which the control signal is constant.

To retain the logic 0 or 1 state on the two output clock lines, each of these lines is connected to an associated repeater cell that retains the signal level when the three-state buffers 35 and 36 are turned off.

Another clock generator is presented that, in response to an input clock signal of frequency f produces a pair of nonoverlapping clock signals of frequency f. This clock generator functions similarly to the clock generator of FIG. 5, but additionally includes self-regulating circuitry that avoids severe variation in the pulse width of the pair of output clock signals produced by this clock generator. This eliminates the problems of the clock generator of FIG. 5 discussed above in the Background of the Invention.

DESCRIPTION OF THE PREFERRED EMBODIMENT

Figure 3:
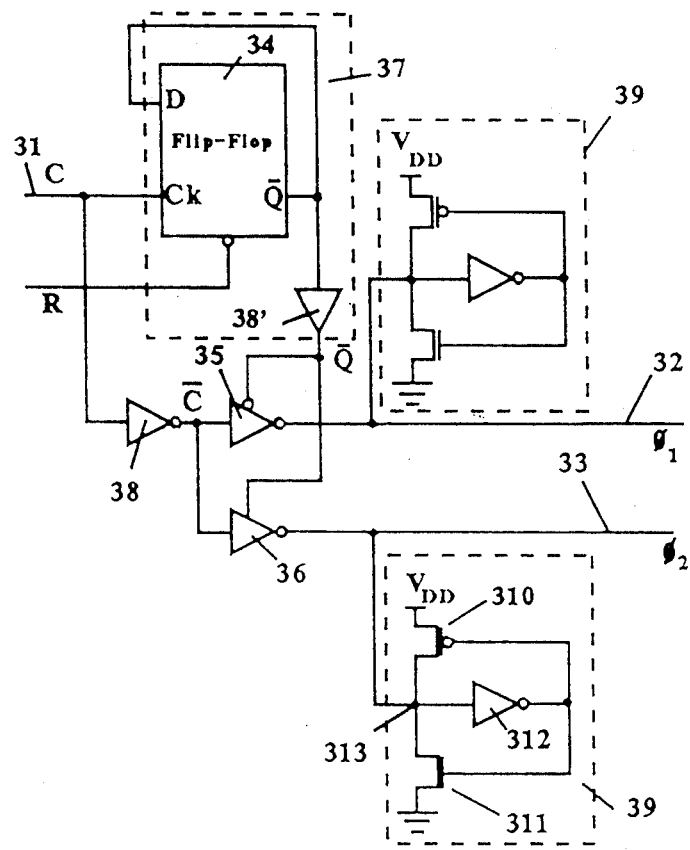
FIG. 3 illustrates a clock generator that, in response to an input clock signal, produces a pair of nonoverlapping output clock signals that do not include a delay from a flip-flop.

FIG. 3 illustrates a clock generator that, in response to an input clock signal C at an input port 31, produces a pair of nonoverlapping output clock signals $\phi_1$ and $\phi_2$ that do not include a delay from a flip-flop. Input port 31 is connected to the clock input of a positive edge D-type flip-flop 34. Input port 31 is also connected through an invertor 38 to a signal input of each of three-state buffers 35 and 36. The output of buffer 35 is connected to an output port 32 and the output of buffer 36 is connected to an output port 33.

In response to input clock signal C, flip-flop 34 produces at its $\overline{Q}$ output port a control signal $\overline{Q}$ having half the frequency of the input clock signal C. Control signal $\overline{Q}$ is applied to an inverting clock input of clocked buffer 35 and is applied to a noninverting clock input of clocked buffer 36. Thus, buffer 35 is enabled only during intervals in which $\overline{Q}$ is low and buffer 36 is enabled only during intervals in which $\overline{Q}$ is high. Flip-flop 34 therefore functions as a state machine that directs every second pulse of clock C to output port 32 and directs the remaining pulses of clock C to output port 33. To achieve this, it is important that none of the pulses of clock signal C overlap a transition in $\overline{Q}$. It is therefore necessary to examine the relative timing of transitions in signals $\overline{C}$ and $\overline{Q}$.

Circuit elements 37 (consisting of D-type flip-flop 34 and a buffer 38') and signal paths between input port 31 and the clock input ports of buffers 35 and 36 produce a delay $D_1$ from the occurrence of a positive-going transition in C to the production of a resulting transition in $\overline{Q}$. Likewise, circuit element 38 and the signal paths between input port 31 and the signal inputs of buffers 35 and 36 produce a delay $D_2$ from the occurrence of a transition in C to the production of a resulting transition in $\overline{C}$. These delays $D_1$ and $D_2$ are selected so that each positive pulse at the signal inputs of buffers 35 and 36 is centered within an interval in which the value of $\overline{Q}$ is constant. Delay $D_1$ is deliberately designed to be greater than delay $D_2$ so that signal $\overline{C}$ at the input of elements 35 and 36 is settled before the arrival of the enabling $\overline{Q}$ signal for elements 35 and 36.

Figure 4:
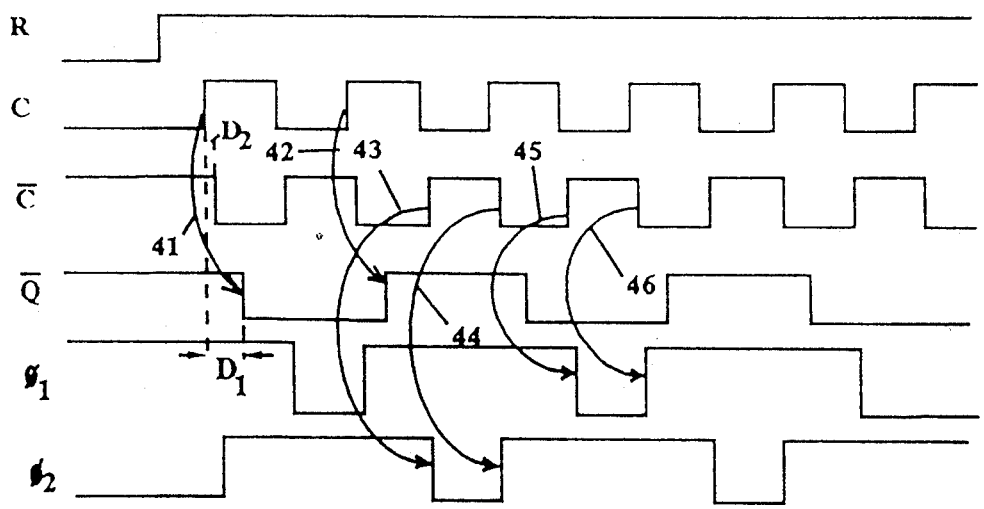
FIG. 4 is a timing diagram for the circuit of FIG. 3.
Figure 5:
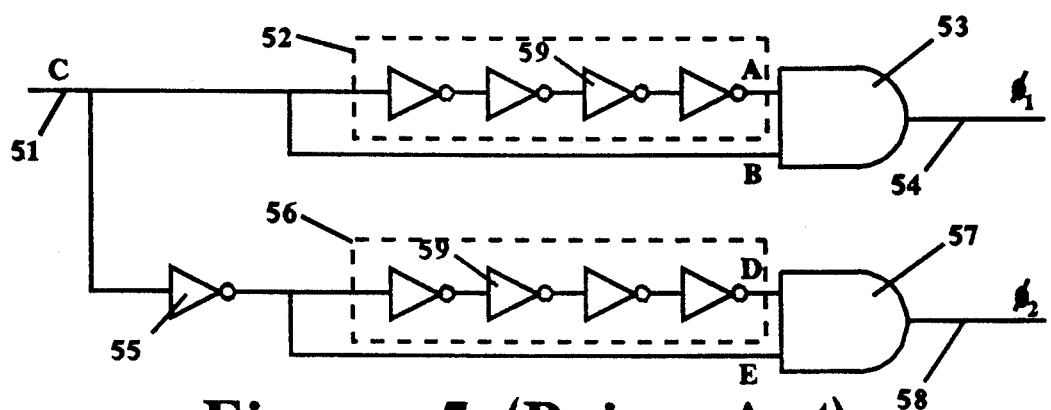
FIG. 5 illustrates a prior art clock generator that produces a pair of output clock signals having the same frequency as an input clock signal.

The operation of this circuit can be understood by reference to the timing diagram of FIG. 4. As indicated by arrows 41 and 42, each positive edge of clock signal C produces a transition in $\overline{Q}$ delayed by a time $D_1$. As indicated by arrows 43 and 44, in intervals when $\overline{Q}$ is high, transitions in C produce transitions in $\phi_2$. As indicated by arrows 45 and 46, in intervals when $\overline{Q}$ is low, transitions in $\overline{Q}$ produce transitions in $\phi_1$.

Connected to each of output ports 32 and 33 is a repeater cell 39, each consisting of a gate 310, a gate 311 and a buffer 312 connected to one another at a node 313 that is also connected to one of the output ports 32 or 33. When a high signal is present on one of these output ports, in its associated repeater cell, gate 310 is open and gate 311 is closed so that a positive voltage source $V_{DD}$ is connected to that output port to provide current needed to maintain that high signal. When a low signal is present on one of these output ports, in its associated repeater cell, gate 310 is closed and gate 311 is open so that a node 312 is connected to ground to function as a sink for current needed to maintain that low signal voltage. Buffers 35 and 36 are each sufficiently powerful to control the binary state of node 313 of its associated repeater cell when that buffer is enabled. As a result of this arrangement, when the buffer connected to either of output ports 32 and 33 is enabled, the output of that buffer determines the value of the output signal on that port and, when that buffer becomes disabled, the repeater cell 39 connected to that output port maintains on that port the signal value present at the time that buffer became disabled.

In the case illustrated in FIG. 4, relative delay $D_1 - D_2$ is less than a half period of clock signal C so that the use of invertor 38 assures that positive pulses of $\overline{C}$ do not overlap transitions in signal $\overline{Q}$.

Figure 1:
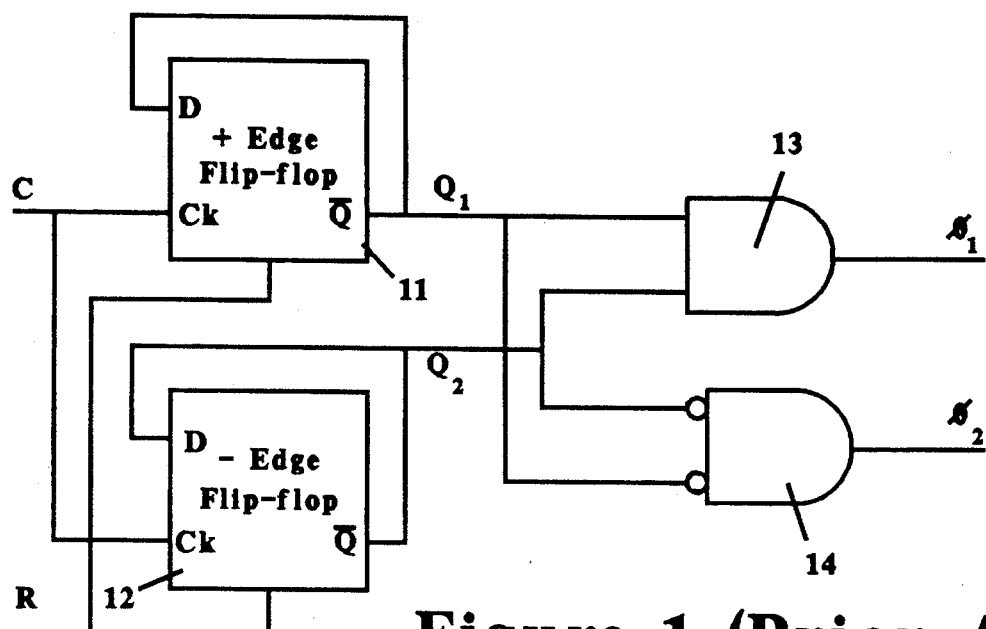
FIG. 1 illustrates a prior art clock generator that can produce a pair of nonoverlapping output clock signals in response to an input clock signal.
Figure 2:
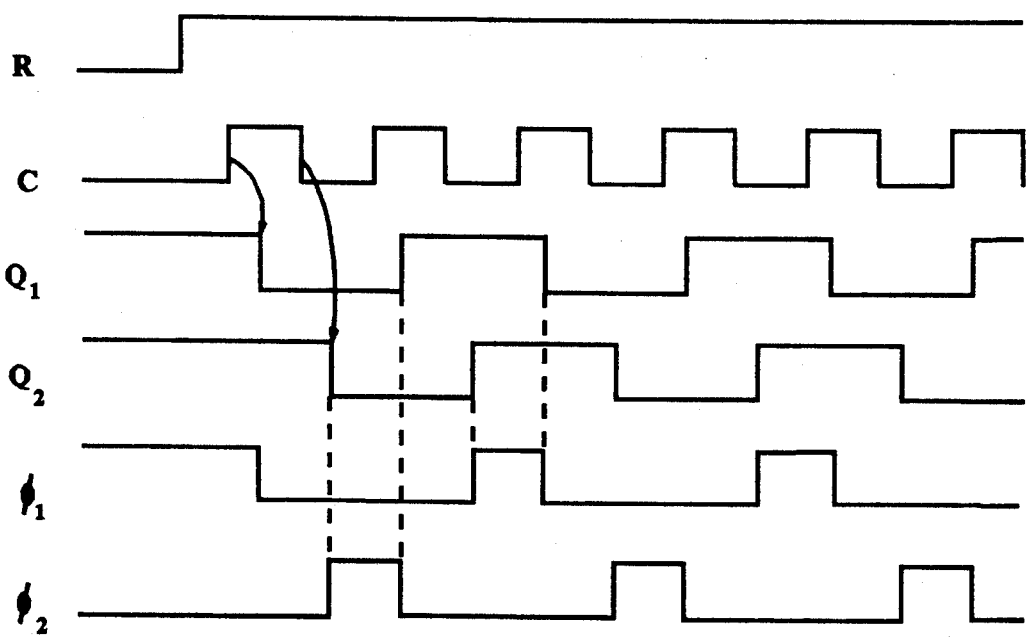
FIG. 2 is a timing diagram for the circuit of FIG. 1.

This clock generator has the advantage that each transition in output clock signals $\phi_1$ and $\phi_2$ is delayed from the associated transition in input clock signal C by an amount equal to $D_2$ plus the delay introduced by buffer 35 or 36. This delay is typically on the order of 2 nanoseconds and is significantly smaller than the delay (on the order of 7 nanoseconds) in the clock generator of FIG. 1 for the input signal to pass through a flip-flop and an AND gate. This delay is much smaller than it is for the clock generator of FIG. 1. A set of ICs utilizing on-chip clock signals produced by the clock generator of FIG. 3 can tolerate a greater degree of skew between clock signals generated on different chips than a set of ICs utilizing a FIG. 1 clock scheme.

Figure 9:
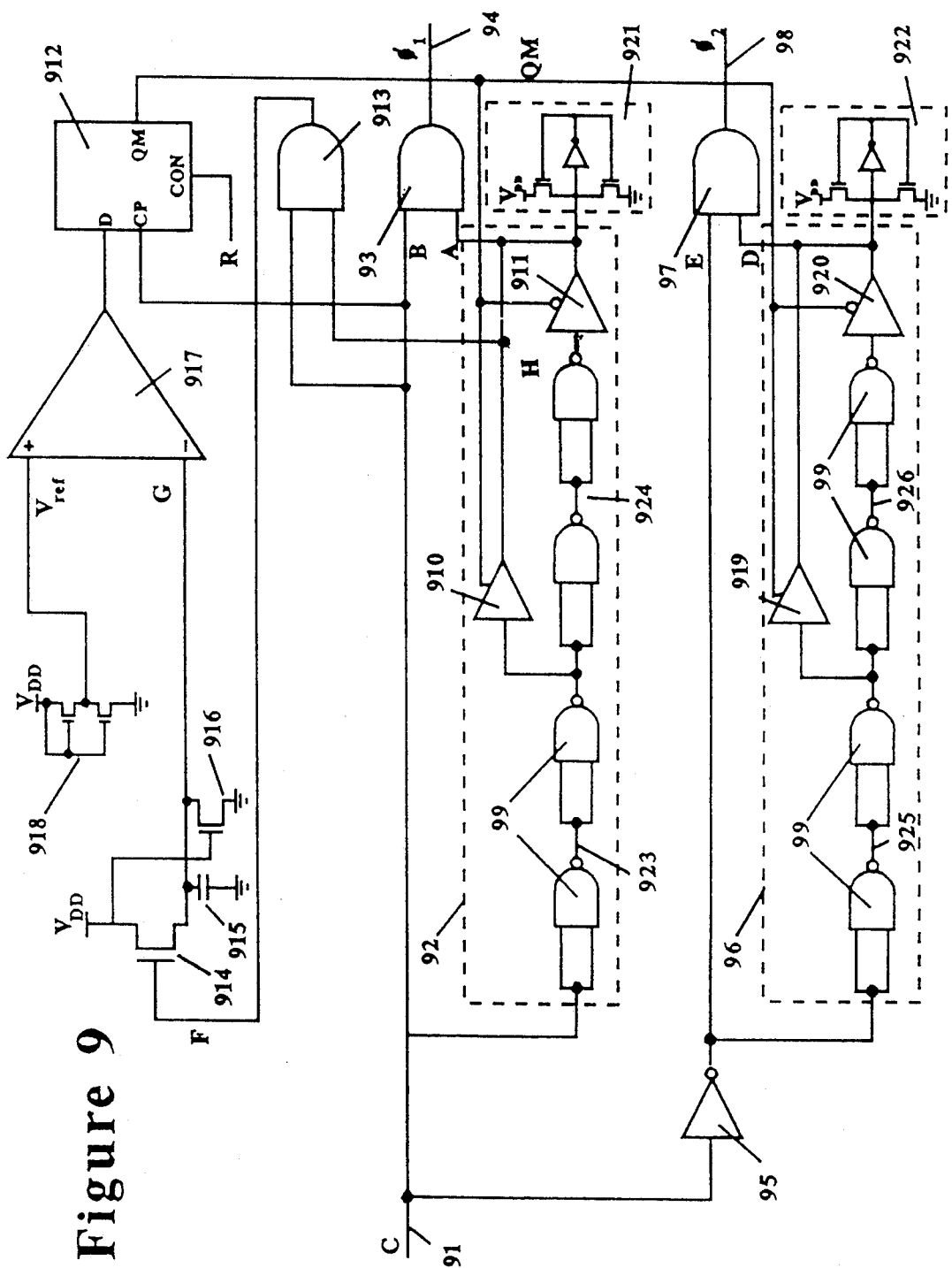
FIG. 9 illustrates a clock generator that, in response to an input clock signal of frequency f, produces a pair of nonoverlapping output clock signals of frequency f.

FIG. 9 illustrates an alternative embodiment of a clock generator that generates a pair of nonoverlapping clock signals and, like in the embodiment of FIG. 4, does not introduce into the clock signal the large delay of a flip-flop. The operation of the circuit of FIG. 9 can be understood by reference to the timing diagram of FIG. 6. At time $t = t_0$, a leading edge of a positive pulse of an input clock signal C is applied to an input port 91 of the clock generator. This input clock signal is applied through a delay element 92 to a first input A of an AND gate 93 and is also applied directly to a second input B of AND gate 93. This produces, at an output port 94 connected to the output of AND gate 93, a first output clock signal $\phi_1$ having a leading edge that is delayed relative to clock signal C by a time $D_3$ equal to the delay of delay element 92. Similarly, input clock signal C is also applied through an invertor 95 and a delay element 96 to a first input D of an AND gate 97 as well as through invertor 95 directly to a second input E of AND gate 97. This produces on an output port 98 connected to the output of AND gate 97 an output clock signal $\phi_2$. In this embodiment, delay elements 92 and 96 each consists of a set of delay elements, such as NAND gates 99, plus some additional circuitry that ensures selection of delay values $D_3$ and $D_4$ that are significantly less than W.

Figure 6:
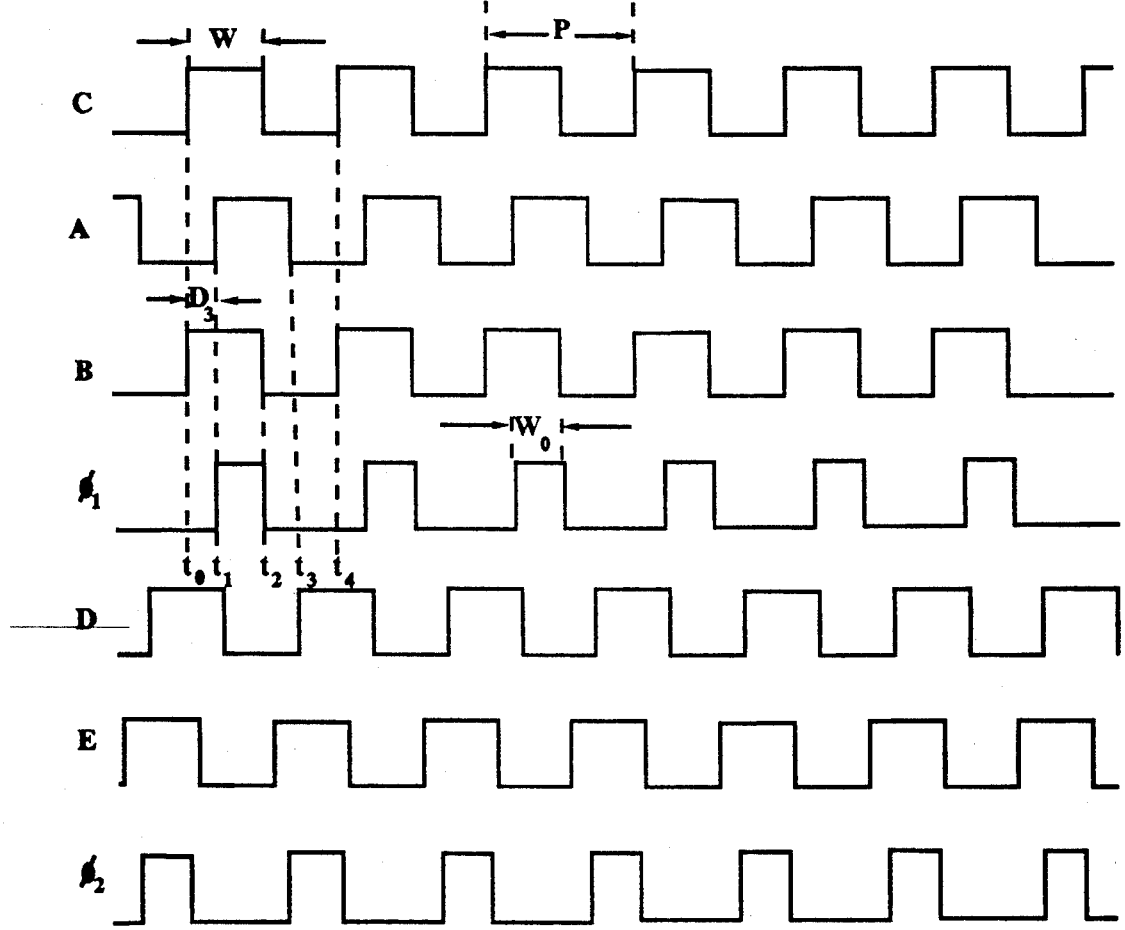
FIG. 6 is a timing diagram for the circuit of FIG. 5.
Figure 7:
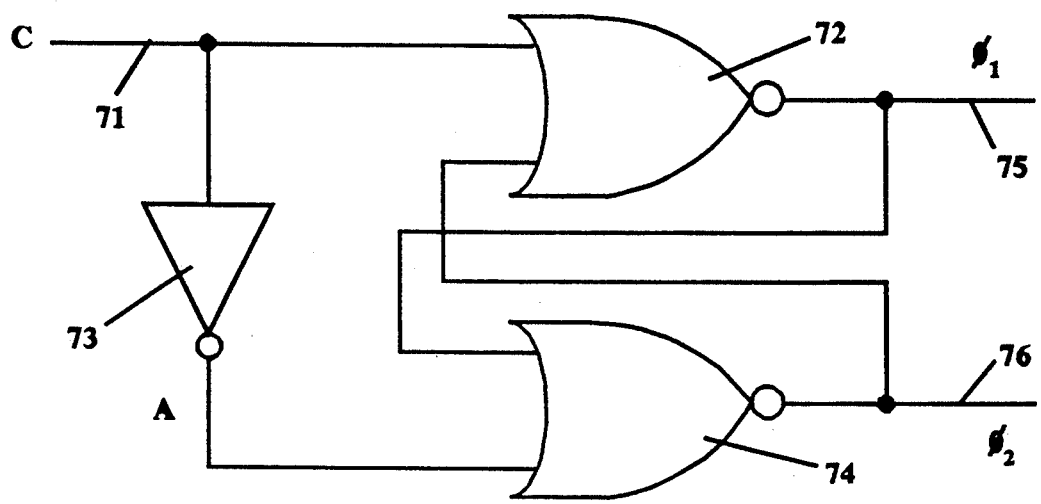
FIG. 7 is another prior art clock generator that is designed to produce a pair of nonoverlapping clock signals of frequency f from an input clock signal of frequency f.
Figure 8:
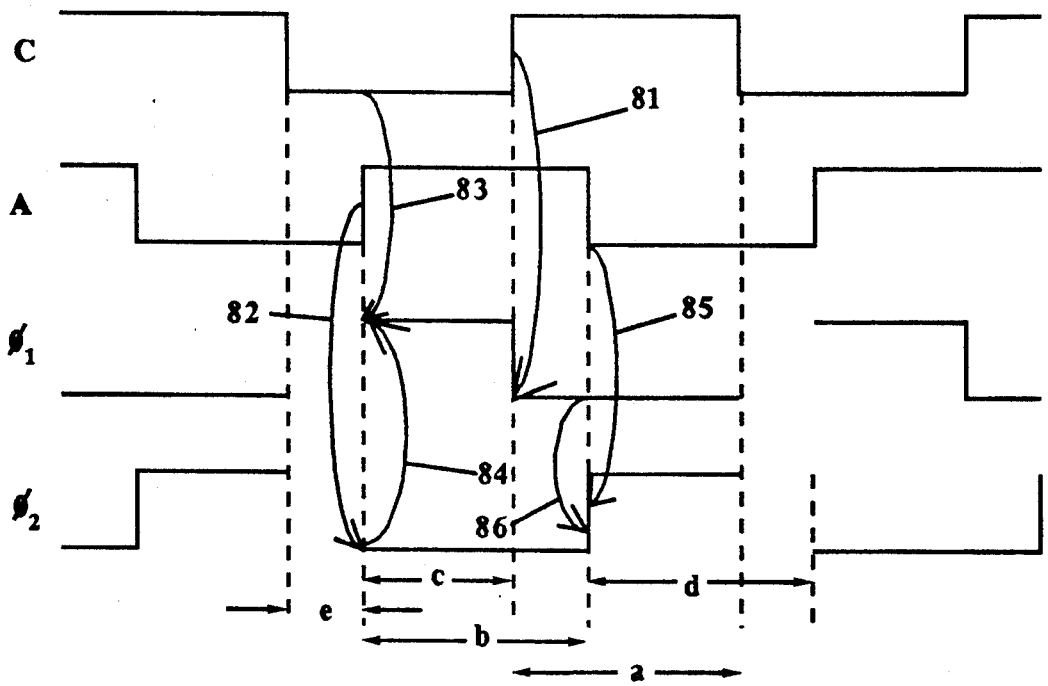
FIG. 8 is a timing diagram for the circuit of FIG. 7.

As illustrated in FIG. 6, the input clock has a period P and positive pulses of width W. In the interval from $t = t_0$ to $t = t_1 \equiv t_0 + D_3$, signal A is low and signal B is high so that $\phi_1$ is low. From time $t = t_1$ to $t = t_2 \equiv t_0 + W$ (where W is the width of a clock pulse), signals A and B are both high so that $\phi_1$ is high. From time $t = t_2$ to $t = t_3 \equiv t_1 W$, signal A is high and signal B is low so $\phi_1$ is low. From time $t = t_3$ to $t = t_4 \equiv t_0 + P$, signals A and B are both low so that $\phi_1$ remains low. Therefore, output clock signal $\phi_1$ has the same period P as input clock signal C.

The generation of output clock signal $\phi_2$ is similar to that of $\phi_1$, except that there is an extra inversion and delay introduced by invertor 95. If clock C had a 50% duty cycle, if the delay $D_3$ of delay element 92 were equal to the delay $D_4$ of delay element 96 and if the delay of invertor 95 were negligible, then this circuit would ensure that output clock signals $\phi_1$ and $\phi_2$ are 180° out of phase and nonoverlapping.

From FIG. 6 it can be seen that the width $W_0$ of the pulses in output clock signals $\phi_1$ and $\phi_2$ are substantially equal only if the duty cycle of clock C is substantially 50%. For this case, the effect of the inversion of clock signal C by invertor 95 is equivalent to a 180° shift of signal E relative to signal B and of signal D relative to signal A. This is used to offset the pulses in output clock signal $\phi_1$ relative to the pulses of output clock signal $\phi_2$ by 180°.

The width $W_0$ of the positive pulses of output clock signal $\phi_1$ is $W-D_3$. If $D_3$ becomes substantially equal to W, then the pulse width $W_0$ of the pulses in output clock signal $\phi_1$ will substantially vanish. Similarly, if $D_4$ becomes substantially equal to W, then the pulse width $W_0$ of the pulses in output clock signal $\phi_2$ will substantially vanish. To ensure that neither of these events occurs, additional circuitry 912 914–919, 921 and 922 is included to sense when $D_3$ and $D_4$ approach too closely to W and then to reduce these two delays.

A pair of buffers 910 and 911 are responsive to a control signal QM to determine whether $D_3$ is equal to the delay of the first two NAND gates 99 of delay element 92 or is equal to the delay of all four NAND gates 99 of delay element 92. Similarly, a pair of buffers 919 and 920 are responsive to control signal QM to determine whether $D_4$ is equal to the delay of the first two NAND gates 99 of delay element 96 or is equal to the delay of all four NAND gates 99 of delay element 96. When QM is high, the clock signal C passes through only the first two NAND gates 99 of each of delay elements 96 and 96. When QM is low, the clock signal C passes through all four NAND gates 99 of both delay elements 92 and 96. Thus, $D_3$ and $D_4$ are each selectively equal to a buffer delay plus either two or four times the delay $D_N$ of a single NAND gate 99.

Elements 912–918 generate control signal QM in a manner that ensures that $D_3$ and $D_4$ do not become substantially equal to W. An AND gate 913 has a first input responsive to clock signal C and a second input responsive to a signal H that is equal to clock signal C delayed by the passage through all four of the NAND gates of delay element 92. AND gate 913 therefore produces an output signal F that has the same period P as clock signal C and has in each period P a single pulse of width $4 \cdot D_N$. Signal F is applied to the gate input of a transistor switch 914 which is held open only during the pulses of signal F. A capacitor 915 and active resistor 916 function as an integrator that integrates the current supplied through switch 914 and apply this integrated signal G to a negative input of a comparator 917. The RC time constant of this integrator is long compared to the period P of clock signal C so that the ac component of G is small. The dc component of G is proportional to $4 \cdot D_N$ and therefore measures the delay through all four of the NAND gates 99 of delay element 92.

A voltage source 918 is connected to the positive input of comparator 917 to provide a reference voltage $V_{ref}$ for the comparator. When G is less than $V_{ref}$, QM is low so that buffer 911 is enabled and buffer 910 is disabled. For this case, $D_3$ equals $4 \cdot D_N$. When G is greater than $V_{ref}$, QM is high so that buffer 910 is enabled and buffer 911 is disabled. For this case, $D_3$ is reduced to $2 \cdot D_N$. The voltage $V_{DD}$ and the widths and lengths of the gate regions of the transistors of voltage source 918 are selected to produce a reference voltage that ensures that $D_3$ does not too closely approach W. In general, $V_{ref}$ is selected so that $(W-D_3)/W$ is on the order of 60%. The ability to choose between delay paths allows this clock circuit to react to changes in temperature, supply voltage and silicon processing, thus providing nonoverlapping clock signals containing optimally sized positive clock pulses.

In an alternative embodiment, more than two buffers can be included within delay elements 92 and 96 to enable selection of the value of $D_3$ and $D_4$ from more than just two values. For example, nodes 923 and 924 can each also be connected through an associated buffer to input A of AND gate 93 and nodes 925 and 926 can each also be connected through an associated buffer to input D of AND gate 97 to enable $D_3$ and $D_4$ to each have selectable values of $D_N$, $2 \cdot D_N$, $3 \cdot D_N$ or $4 \cdot D_N$. In addition, the number of delay elements 99 in series in each of delay elements 92 and 96 can be increased to some integer N greater than 4 so that more than 4 possible values of delay can be selected. Each node between adjacent pairs of NAND gates 99 in delay element 92 would be connected in parallel to inputs of AND gate 93. Similarly, delay element 96 would include N delay elements and N buffers. In place of elements 917 and 918, well known analog-to-digital circuitry would distinguish N different levels of signal F produced by AND gate 913. If the Nth of these levels of signal F were produced, then only the Nth buffer in each of delay elements 92 and 96 would be enabled.

I claim:
1. A clock generator comprising:
    a D-type flip-flop having a clock input, a D input and an inverting output, said D input being connected to said inverting output;
    a first buffer having a signal input connected to the clock input of the D-type flip-flop, having an inverting enable input connected to the output of the D-type flip-flop and having an output at which a first output clock signal is produced;
    a second buffer having an input connected to the clock input of the D-type flip-flop, having an enable input connected to the output of the D-type flip-flop and having an output at which a second output clock signal is produced.
2. A clock generator as in claim 1 further comprising:
    a first repeater cell connected to the output of the first buffer; and
    a second repeater cell connected to the output of the second buffer.
3. A clock generator as in claim 1 further comprising:
    an inverting buffer connected between the clock input of the D-type flip-flop and the inputs of said first and second buffers.
4. A clock generator as in claim 3 further comprising:
    a third buffer connected between the output of the D-type flip-flop and the enable inputs of the first and second buffers.

* * * * *